United States Patent
Nelson et al.

(10) Patent No.: US 6,242,920 B1
(45) Date of Patent: Jun. 5, 2001

(54) APPARATUS FOR USE IN A DMM FOR MEASURING THE BATTERY VOLTAGE OF THE DMM

(75) Inventors: Theodore G. Nelson, Portland; James R. Brooks, Beaverton, both of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/156,319

(22) Filed: Sep. 18, 1998

(51) Int. Cl.[7] ................. G01N 27/416; G01R 13/02; G01R 19/25; G01R 31/36
(52) U.S. Cl. ................. 324/427; 324/426; 324/115
(58) Field of Search ................. 324/426, 427, 324/433, 115

(56) References Cited

U.S. PATENT DOCUMENTS

| | | | | |
|---|---|---|---|---|
| 4,271,392 | * | 6/1981 | Outram et al. | 324/115 |
| 5,434,495 | * | 7/1995 | Toko | 324/427 X |
| 5,572,136 | * | 11/1996 | Champlin | 324/426 |
| 5,585,728 | * | 12/1996 | Champlin | 324/427 |
| 5,821,756 | * | 10/1998 | McShane et al. | 324/427 |
| 5,870,025 | * | 2/1999 | Hinohara | 340/636 |

* cited by examiner

Primary Examiner—Glenn W. Brown
(74) Attorney, Agent, or Firm—Thomas F. Lenihan

(57) ABSTRACT

A circuit for use in a DMM utilizes an auxiliary A/D converter to measure the battery voltage of the DMM and displays the result on the LCD display screen of the DMM. The user receives a numeric indication of the battery voltage measured, rather than a simple good/bad or bar graph indication. The voltage measured provides the user with a quantitative indication which allows the user to determine how close the battery is to being exhausted. Thus, the user can be made aware of a weakened state of the battery before operation of a backlight further drains the battery to an unacceptably low level.

9 Claims, 5 Drawing Sheets

APPARATUS FOR USE IN A DMM FOR MEASURING THE BATTERY VOLTAGE OF THE DMM

FIELD OF THE INVENTION

The subject invention concerns the field of self-measurement of battery voltage which powers portable instruments in general, and concerns the self measurement of the battery voltage in a DMM in particular.

BACKGROUND OF THE INVENTION

A multimeter, as the name suggests, is an instrument which is capable of measuring a number of different parameters, such as voltage, current, resistance, and the frequency of an input signal. Modern digital multimeters (DMMs) have become quite advanced and are also sometimes capable of measuring capacitance, duty factor, and temperature. It is common for DMMs to be used for making measurements at remote locations which do not provide ready access to an AC power line, and for this reason, multimeters typically are battery powered. These remote locations could be almost anywhere, for example, at the top of a telephone pole, inside a sewer drainpipe, or at the top of a mountain.

It is very irritating to a user of a DMM to get to one of these locations, prepare to make a measurement, and then discover that the batteries which power the DMM are very weak or dead. To alleviate this annoyance, many premium DMMs include LOW BATTERY indicators. Typically, these indicators tend to light up when the battery has only just a few minutes of battery life remaining. Unfortunately, a non-illuminated LOW BATTERY warning indicator actually gives a false indication of good battery condition when the battery voltage is slightly above the warning light set point. In such a case the user might think that the battery was good, only to have the LOW BATTERY warning indicator illuminate in response to the user turning on the back light for his display. This occurs because the back light, when on, generally uses about ten times the current normally drawn by the rest of the DMM when the back light is off. Thus, the use of the backlight tends to load the weak battery, and causing its terminal voltage to drop even faster, and thereby causes the LOW BATTERY indicator to illuminate. In such a case the user may note that the battery appears good before climbing down into a sewer to make a measurement. He would then be unpleasantly surprised, upon lighting the DMM backlight in preparation for performing the measurement, to find that the LOW BATTERY warning indicator is now illuminated.

From the above example, it seems clear that relying upon a single threshold voltage level to determine battery life is not an optimum solution for the process. An alternative solution is the one chosen by battery indicators found in the camcorder and laptop computer arts. This solution to the problem uses a bar graph (thermometer-type) depiction of battery life. The bar graph is driven in response to the battery voltage crossing a series of thresholds. Unfortunately, the graphs tend to be nonlinear. That is, the graphs do not convey that the time to discharge the battery through the last quarter of the graph is very much shorter than the time to discharge through the first quarter of the graph, due to battery discharge characteristics. This uncertainty is compounded by the fact that the user does not know the value of an individual segment of the bar graph.

One might think that it is a simple matter for a voltage measuring device to measure its own battery voltage. Unfortunately, this is not true, for several reasons. Modern DMMs are precision instruments employing highly sophisticated Analog to Digital Converters (A/Ds). These A/Ds are highly accurate in the center of their dynamic range but tend to be less accurate as the input voltage being measured approaches a respective power supply rail of the A/D converter. The battery voltage powering the DMM is at least a large portion of the power supply rail voltage of the DMM (even if a DC to DC Boost circuit is employed to expand the dynamic range of the A/D converter). Moreover, the input A/D converter is expected to measure both positive and negative voltages. In order to accomplish this task, the input A/D converter is biased to the midpoint of the battery supply voltage (which is essentially the same as operating from a bipolar supply wherein each half of the bipolar supply is equal to half the total battery voltage). The result is that the power supply voltage for the input A/D converter is outside the usable range of the input A/D converter. Thus, as strange as it seems, the DMM cannot use its own measuring circuitry to measure its own power supply voltage.

What is needed is a multimeter battery-state indicator which overcomes the above noted difficulties.

SUMMARY OF THE INVENTION

A circuit for use in a DMM utilizes an auxiliary A/D converter to measure the battery voltage of the DMM and displays the result on the LCD display screen of the DMM. The user receives a numeric indication of the battery voltage measured, rather than a simple good/bad or bar graph indication. The voltage measured provides the user with a quantitative indication which allows the user to determine how close the battery is to being exhausted. Thus, the user can be made aware of a weakened state of the battery before operation of a backlight further drains the battery to an unacceptably low level.

DETAILED DESCRIPTION OF THE INVENTION

Figure 1:
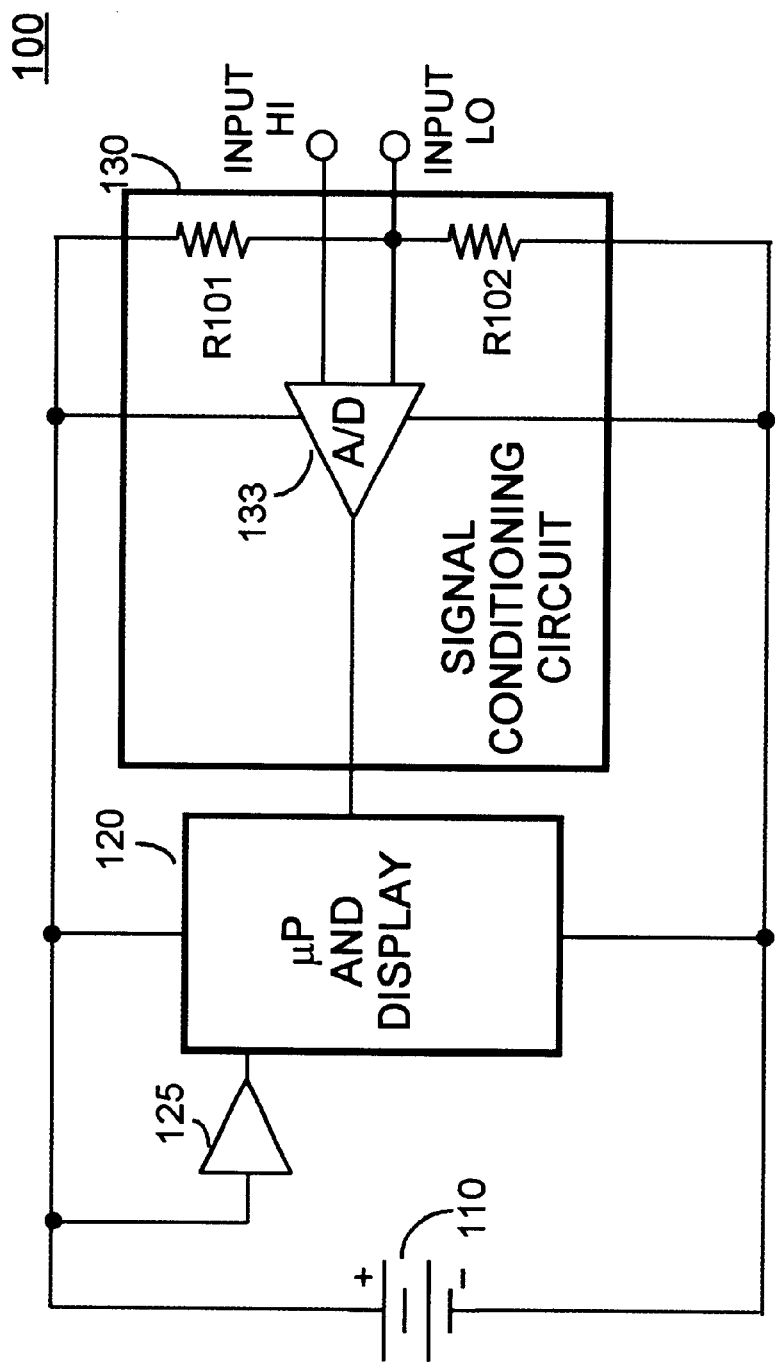
FIG. 1 shows circuitry in accordance with the prior art.

A simplified block diagram view of a typical DMM 100 of the prior art is shown in FIG. 1. DMM 100 includes a battery 110 for providing operating power to the DMM. DMM 100 also includes a microprocessor ($\mu$P) and display unit 120, a comparator 125, and a signal conditioning circuit 130. Signal conditioning circuit 130 includes an A/D converter 133 coupled to a pair of input terminals INPUT HI and INPUT LO. The signal line coupled to the INPUT LO terminal is biased to a predetermined level by a connection to the centerpoint of a resistor divider comprising resistors R101 and R102. In operation, signals to be measured are applied to terminals INPUT HI and INPUT LO. Signal conditioning circuit 130 received the output of A/D converter and the resulting processed digital signal is applied to $\mu$P and Display unit 120 for display on the LCD of DMM 100. The battery voltage of battery 110 is applied to an input of comparator 125 for comparison against an internal reference level. When the battery voltage drops below the internal reference voltage threshold, a signal is generated and applied to μP and Display unit 120 which causes the BATTERY LOW warning indicator to light. The BATTERY LOW warning indicator is generally a display on the LCD, although it could be a separate warning lamp.

Figure 2:
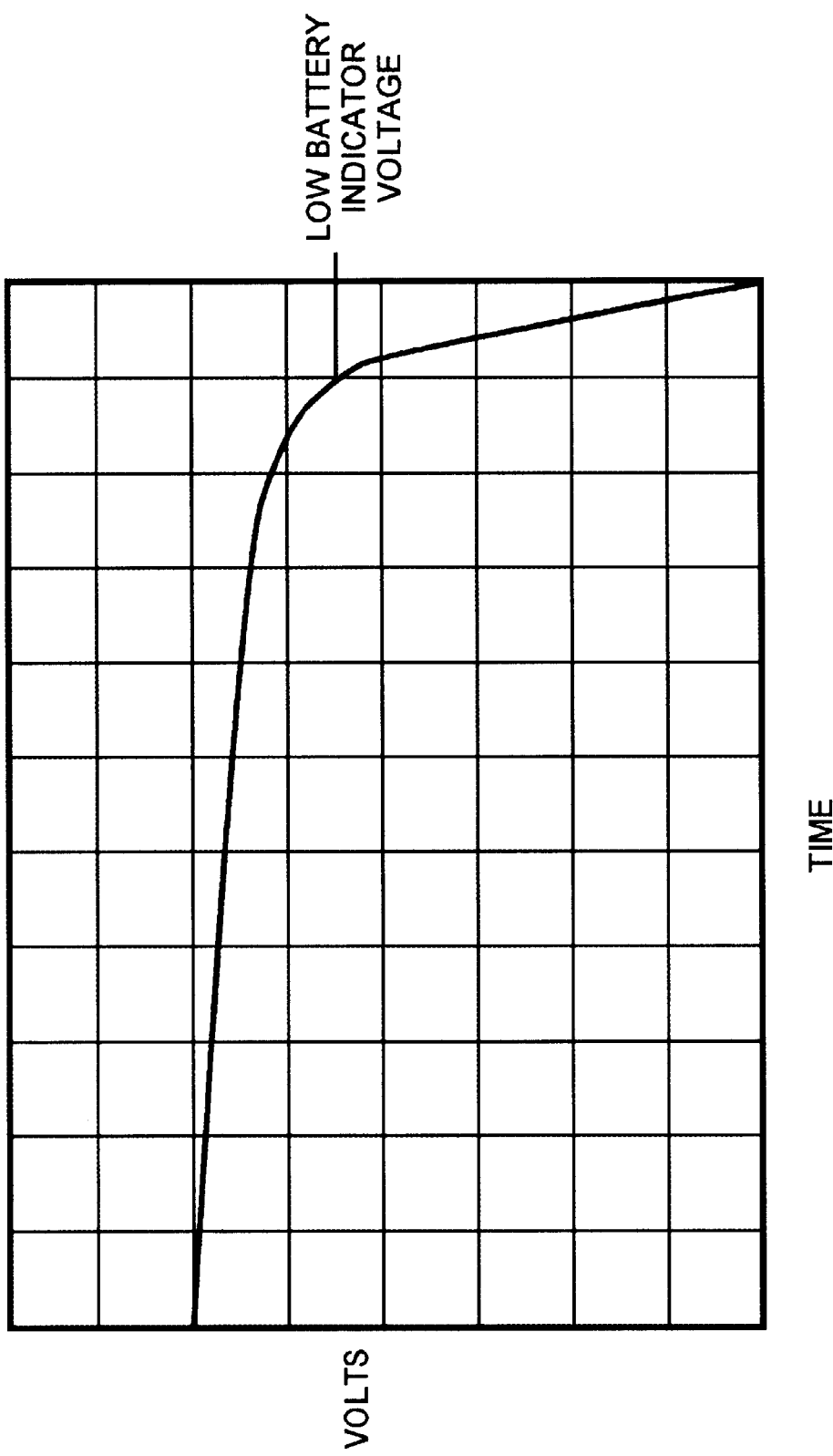
FIG. 2 shows a graph of battery voltage versus time, and is useful in understanding the invention.

FIG. 2 shows typical battery life over time in terms of its terminal voltage. Note that the battery starts at a given voltage and decreases slowly and fairly linearly to a point at which the rate of decline increases dramatically. The low battery indicator voltage threshold is usually set as shown, around the knee of the curve. This explains the nonlinear behavior of the thermometer type bar graph battery life displays, in that the first quarter of battery life has a much lower slope than does the final quarter of battery life.

Figure 3:
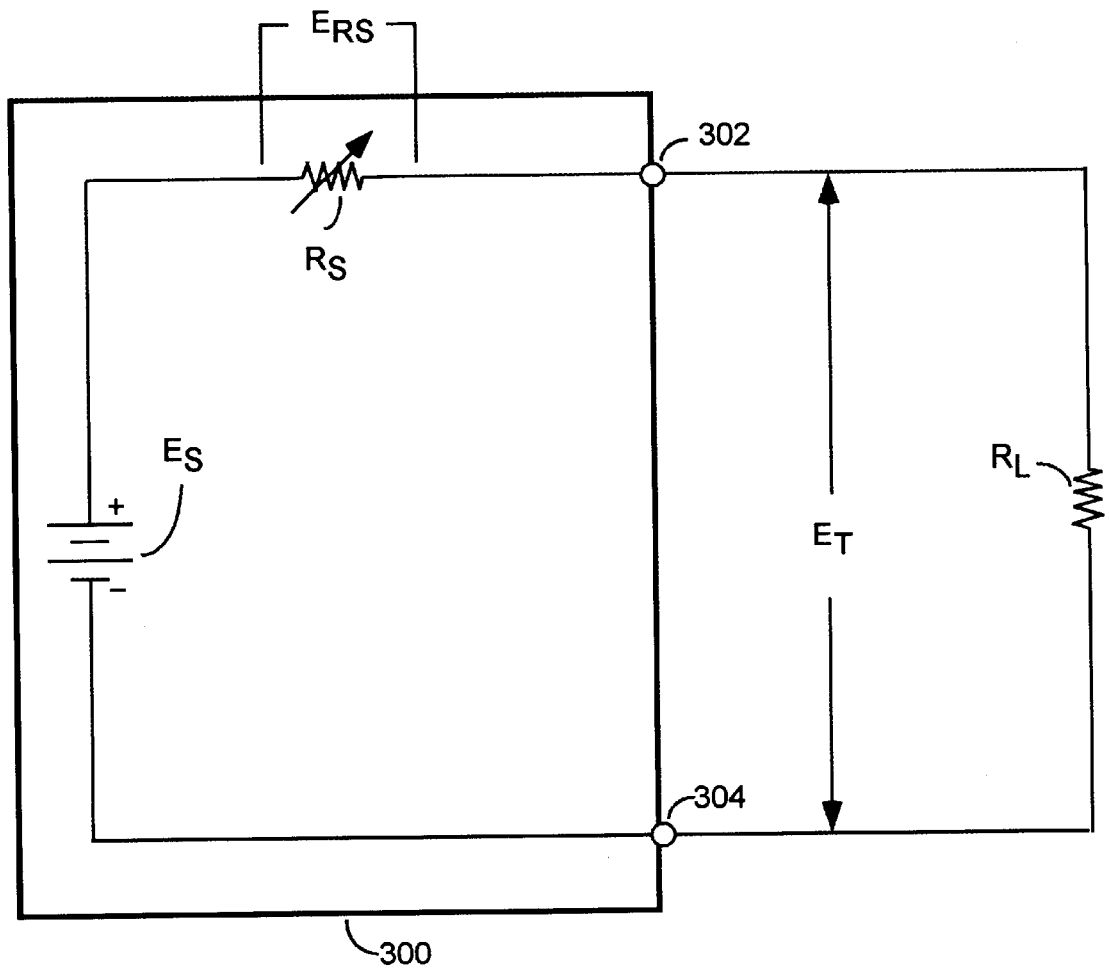
FIG. 3 is an illustration of a circuit including a model of a practical battery, and is useful in understanding the graph of FIG. 2.

The circuit of FIG. 3 helps explain the graph of FIG. 2. When one considers batteries, one usually thinks of an ideal voltage source having a constant terminal voltage which is independent of the current being provided. Unfortunately, batteries in the real world are not ideal voltage sources for all current conditions. In practical voltage sources the terminal voltage $E_T$ decreases as the load current drawn from the source increases.

It is common to account for this effect by representing a practical battery as an ideal voltage source having a voltage $E_S$ coupled in series with an internal series resistor $R_S$, as shown in FIG. 3. The output voltage $E_T$ of the practical battery is developed across a pair of battery terminals 302 and 304. The load (i.e., current drawing element) is represented in FIG. 3 as a resistor $R_L$. Thus, load resistor $R_L$ and Voltage Source resistance $R_S$ form a voltage divider network, and as load resistor $R_L$ draws current, a voltage drop $ER_S$ occurs across the voltage source internal resistance $R_S$ causing the terminal voltage to drop. The equation for the terminal voltage is:

$$E_T = E_S \times R_L/(R_L + R_S) \quad \text{(Equation 1)}$$

Thus, with a fixed value for $R_S$, the terminal voltage $E_T$ decreases in an inverse relationship to the current drawn. Unfortunately, the internal resistance of the battery $R_S$ also increases with age as the battery becomes exhausted. For that reason voltage source internal resistance $R_S$ is represented in FIG. 3 as a variable resistor. The increasing internal series resistance $R_S$ of the battery explains decreasing terminal voltage $E_T$ of the battery over time, as shown in the graph FIG. 2.

Figure 4:
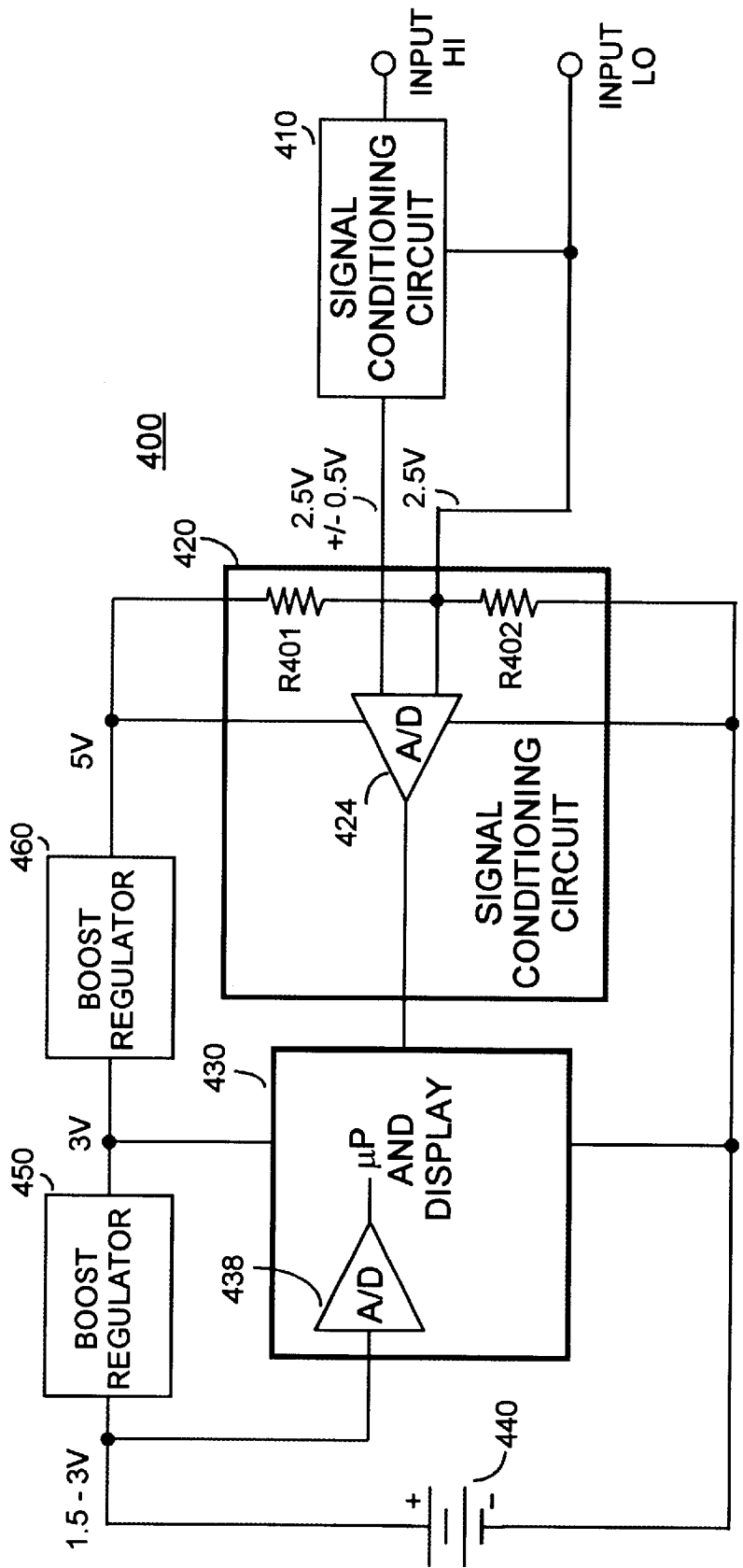
FIG. 4 shows circuitry in accordance with the subject invention.

Apparatus in accordance with the subject invention is shown in FIG. 4, wherein a DMM generally designated 400 includes a pair of signal input terminals INPUT HI and INPUT LO, a first Signal Conditioning Circuit 410, a second Signal Conditioning Circuit 420, a Microprocessor (μP) and Display Unit 430, a Battery 440, a first Boost Regulator 450 and a second Boost Regular 460. DMM input terminal INPUT HI and INPUT LO receive the signal to be measured from the circuit under test, and couple it to first Signal Conditioning Circuit 410. The signal developed at the output of first Signal Conditioning Circuit 410 is conditioned to be in the range of 2.5 volts plus or minus 0.5 v. This signal is then applied to one input of an A/D converter 424 within second Signal Conditioning Circuit 420. The INPUT LO terminal is coupled to a second input of A/D converter 424, and to the centertap of a resistor divider comprising equal value resistors R401 and R402. The resistor divider is arranged between the 5-volt power supply rails which provide operating power to A/D converter 424. This arrangement biases the reference input terminal (i.e., that terminal coupled to INPUT LO) of A/D converter 424 to 2.5 volts. This is essentially the same as operating the A/D from bipolar rail voltages of +2.5 volts and −2.5 volts and biasing the reference terminal to 0 volts.

Battery 440 is nominally 3 volts, but may actually measure anywhere from 1.5 volts to 3 volts depending upon its usage and condition. The battery voltage is provided to First Boost Regular 450 which provides a regulated output voltage at 3 volts, and couples the 3 volt regulated power supply to μP and Display unit 430. The regulated 3 volt supply is also applied to the input of second Boost Regulator 460 which develops a 5 volt regulated power supply voltage at its output. The 5 volt regulated power supply voltage is applied to the aforementioned resistor divider, and to second Signal Conditioning Circuit 420 to power A/D converter 424 and other circuitry, not shown for simplicity. Boost regulators 450 and 460 may be an MC33463 regulator circuit manufactured by Motorola Corporation, for example.

As noted above, input A/D 424 is a high precision device which operates most effectively within a dynamic range which is centered about the middle of the power supply range, and which is bounded to stay at least one volt above the lower rail and at least 1 volt below the upper rail. Clearly then, a primary reason for employing second Boost Regulator 460 is to apply a higher power supply voltage to the rails of input A/D converter 424, in order to increase the useable dynamic range of the device. In practice, raising the power supply to 5 volts enables the A/D dynamic range boundaries to be positioned 2 volts away from the respective power supply rails. For a 5-volt supply, the upper boundary of the dynamic range is 3 volts, and the lower boundary of the dynamic range is 2 volts.

One can now begin to appreciate the difficulty in using input A/D 424 to measure the battery voltage. If one attempts to connect the negative lead from INPUT LO to the negative terminal of the battery, that would effectively short out R402, removing it from the circuit and upsetting the bias for input A/D converter 424. On the other hand, one might choose to ignore the negative connection, and apply only the voltage from the positive battery terminal directly to the input terminal of input A/D converter 424. However, in this case, the DMM would not measure 3 volts (as expected) but would instead read the difference between the 2.5 volt reference level and 3 volts, or 0.5 volts. This is a somewhat strange reading to convey to a user. Moreover, if the battery had depleted to 2.5 volts, the DMM would measure and display it as 0 volts, again an unacceptable answer.

Apparatus according to the invention includes a second A/D converter 438 for measuring the battery voltage and applying the measurement value to a microprocessor for display. It is herein recognized that second A/D converter 438 does not have to be a high precision A/D converter and can therefore operate with a dynamic range which extends all the way between its own power supply rails. Advantageously, such a second A/D converter is found in several commercially available control microprocessors, such as the NEC μPD 78064, manufactured by NEC Corporation. By connecting the input lead of A/D converter directly to the positive terminal of battery 440, Microprocessor (μP) and Display Unit 430 can control A/D converter 438 to sample the battery voltage and report back the voltage level of the battery. Microprocessor (μP) and Display Unit 430 can then display the actual battery voltage on the LCD display of DMM 400. Unlike the bar graph display of the prior art, the user is presented with a numeric display of actual battery terminal voltage with which the user can determine battery condition. It is also noted that the battery is always measured under load (i.e., with the LCD display energized) because the display is used to present the measurement to the user.

Figure 5:
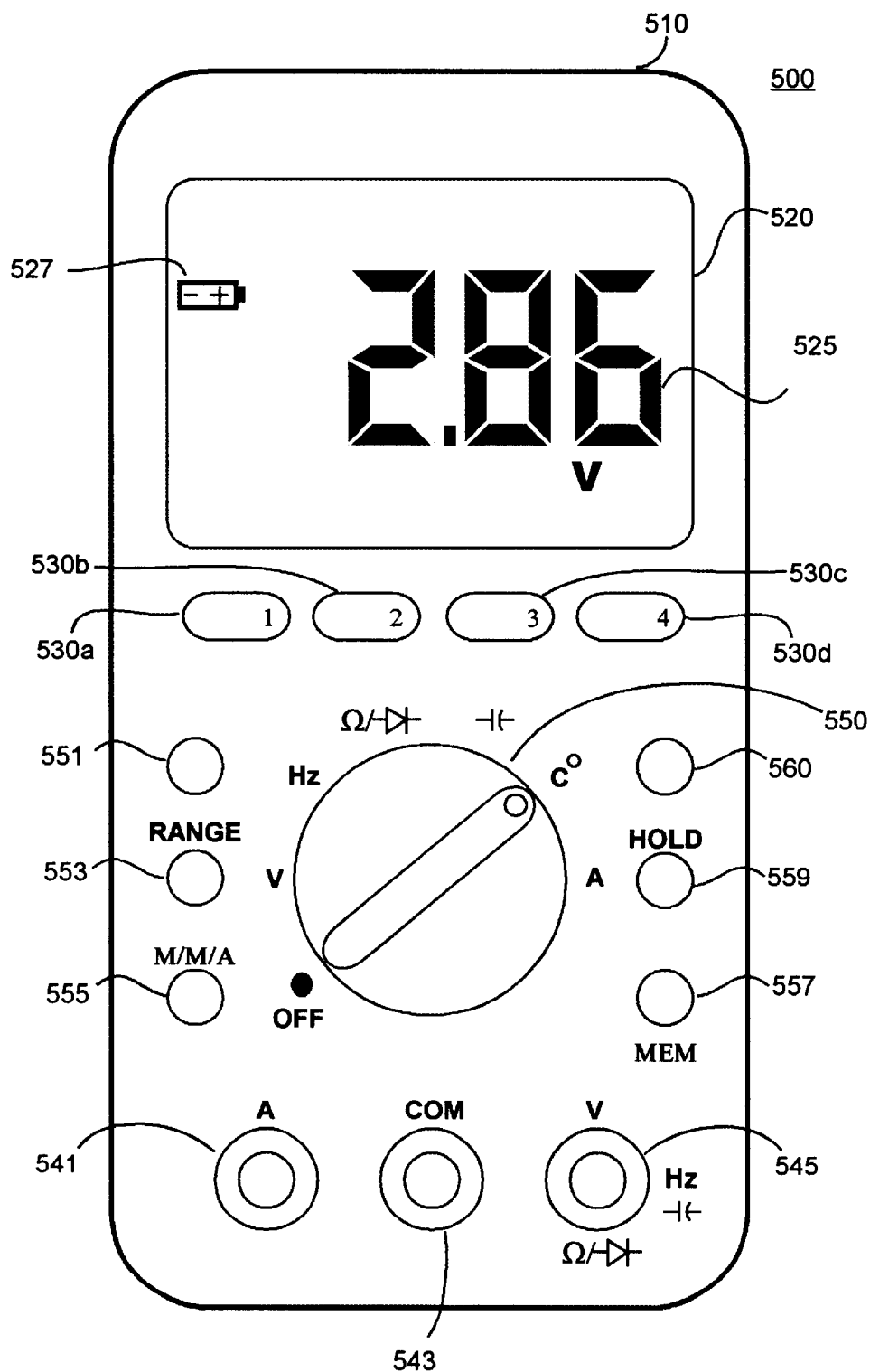
FIG. 5 shows a digital multimeter (DMM) in accordance with the invention.

Referring to FIG. 5, a digital multimeter DMM 500 in accordance with the invention comprises a housing or case 510, and an LCD display 520. LCD Display 520 is shown displaying digits 525 indicative of the state of the internal battery voltage. A LOW BATTERY warning indicator 527 is also provided as a reminder to check the internal battery voltage. Other features of DMM 500 are Softkeys 530*a*, 530*b*, 530*c*, and 530*d* which are utilized to select various DMM measurement parameters. DMM 500 includes a single AMPS input terminal 541, a VOLTS input terminal 545, and a common input 543. A rotary function selection switch 550 has only a single position for each function to be exercised. There are five other buttons 551, 553, 555, 557, and 559 which are used for accessing further features of the DMM. A sixth button 560 activates a backlight to provide easier viewing in low light conditions.

Unfortunately, there is no magic backlight device that uses little or no power. Therefore, as in the prior art, the backlight device of the subject invention also causes the current drawn from the battery to increase by a factor of ten. This causes the battery to discharge at a rate which is ten times faster than the discharge rate when the backlight is non-illuminated. The advantage in the subject invention is that the user knows specifically what the battery voltage is, and therefore what the condition of the battery is, before turning on the backlight. Thus, there should be no surprises such as were described with respect to the prior art.

The term "microprocessor", as applied to element 430 is intended to encompass microcomputers, and other forms of controllers such as dedicated hardware controllers including ASICs.

While the invention has been described with respect to a digital multimeter, it is herein recognized that it would is also applicable to other types of test and measurement equipment, and such modification is deemed to lie within the scope of the following claims.

What is claimed is:

1. A digital multimeter, comprising:

a battery for providing operating power to said multimeter;

an input for receiving an external analog signal to be measured;

a first A/D converter coupled to said input for converting said external analog signal to digital data;

a controller coupled to said first A/D converter for receiving said digital data;

a display device, coupled to said controller, for displaying digits representative of the value of said digital data; and a second A/D converter coupled to said battery for measuring a voltage level present on a terminal of said battery;

said second A/D converter being coupled to said controller and providing numerical data representative of said voltage present on said terminal of said battery, said controller causing said numerical data to be displayed on said display device.

2. The digital multimeter of claim 1 further comprising:

a circuit for increasing the magnitude of the battery voltage for providing operating power to said first A/D converter and extending the dynamic range of said first A/D converter.

3. The digital multimeter of claim 2 wherein said second A/D converter is formed within an integrated circuit including said controller and exhibits a dynamic range encompassing an expected range of battery voltages.

4. An electronic test and measurement instrument, comprising:

a battery exhibiting a given voltage for providing operating power to said instrument;

an input for receiving an analog signal to be measured;

a first A/D converter coupled to said input for converting said signal to digital signal to digital data, said first A/D converter being biased about a midpoint of said given voltage in order to measure both positive and negative polarities of said analog signal;

a controller coupled to said first A/D converter for receiving said digital data;

a display device, coupled to said controller, for displaying digits representative of the value of said digital data; and a second A/D converter coupled to said battery for measuring a voltage level present on a terminal of said battery;

said second A/D converter being coupled to said controller and providing numerical data representative of said voltage present on said terminal of said battery, said controller causing said numerical data to be displayed on said display device.

5. The instrument of claim 4 further comprising:

a circuit for increasing the magnitude of the battery voltage for providing operating power to said first A/D converter and extending the dynamic range of said first A/D converter.

6. The instrument of claim 4 wherein said second A/D converter is formed within an integrated circuit including said controller and exhibits a dynamic range encompassing an expected range of battery voltages.

7. A digital multimeter, comprising:

a battery having a given terminal voltage, said terminal voltage being subject to a decrease in magnitude over time;

a first A/D converter for use in measuring external signals;

a second A/ID converter for monitoring said terminal voltage of said battery a display device for displaying numerical information; and a controller for reading data from said first and second A/D converters and causing a display on said display device of numerical data representative of said data read from said first and second A/D converters.

8. The digital multimeter of claim 7, further comprising:

a circuit for increasing the magnitude of the battery voltage for providing operating power to said first A/D converter and extending the dynamic range of said first A/D converter.

9. The digital multimeter of claim 7, wherein said second A/D converter is formed within an integrated circuit including said controller and exhibits a dynamic range encompassing an expected range of battery voltages.

* * * * *